United States Patent [19]

Meda

[11] Patent Number: 4,789,644
[45] Date of Patent: Dec. 6, 1988

[54] PROCESS FOR FABRICATION, BY MEANS OF EPITAXIAL RECRYSTALLIZATION, OF INSULATED-GATE FIELD-EFFECT TRANSISTORS WITH JUNCTIONS OF MINIMUM DEPTH

[75] Inventor: Laura Meda, Milan, Italy

[73] Assignee: SGS Microelettronica SpA, Milan, Italy

[21] Appl. No.: 946,187

[22] Filed: Dec. 22, 1986

[30] Foreign Application Priority Data

Dec. 23, 1985 [IT] Italy ............................. 23356 A/85

[51] Int. Cl.$^4$ ............................................. H01L 21/36
[52] U.S. Cl. ......................................... 437/41; 437/46; 437/99
[58] Field of Search ....................... 437/41, 46, 99, 940

[56] References Cited

U.S. PATENT DOCUMENTS 3,900,345  8/1975  Lesk .................................... 148/1.5
4,463,492  8/1984  Maeguchi ........................... 29/576 B
4,609,407  9/1986  Masao et al. ........................ 148/1.5

Primary Examiner—Olik Chaudhuri
Attorney, Agent, or Firm—Wenderoth, Lind & Ponack

[57] ABSTRACT

A process for fabrication, by epitaxial recrystallization, of insulated-gate field-effect transistors with junctions of minimum depth, includes the formation of a layer of polycrystalline silicon on a substrate of monocrystalline silicon in predetermined areas to form source and drain regions of an insulated-gate field-effect transistor, aligned with a gate electrode of this transistor. Doping impurities are then introduced in the layer by ion implantation, using an implantation energy sufficient to render the entire layer of polycrystalline silicon amorphous and so as to pass the polycrystalline to monocrystalline interface. Finally, epitaxial recrystallization of the silicon rendered amorphous, starting from the substrate itself, in predetermined areas, is effected by a low-temperature heat treatment.

4 Claims, 2 Drawing Sheets

PROCESS FOR FABRICATION, BY MEANS OF EPITAXIAL RECRYSTALLIZATION, OF INSULATED-GATE FIELD-EFFECT TRANSISTORS WITH JUNCTIONS OF MINIMUM DEPTH

BACKGROUND OF THE INVENTION

This invention pertains to insulated-gate field-effect transistors (IGFET) and, more specifically, to a process for fabrication of IGFETs with a high speed response in high-density integrated circuits.

To achieve high integration density and a high speed response, both the horizontal as well as the vertical dimensions of the IGFET transistors must be reduced (i.e.—the Scaling Principle). In particular, it is necessary to decrease the depth of the drain and source junctions in the substrate. In the usual commercially available IGFET, the use of very thin junctions in general also involves negative consequences, e.g.—it actually increases the layer resistance of the active regions and decreases the reliability of the contacts between these regions and the related electrodes.

To avoid such difficulties, the embodiment of IGFET has been proposed with active source and drain regions formed on the substrate surface, instead of inside thereof. A structure of this type may be achieved by means of selective epitaxy, as is, for example, described in Italian Patent Application No. 21968 A/84 of the inventor herself, which, however, requires the use of dedicated reactors, capable of making epitaxial films grow, in a reproducible way, from the gaseous phase, and the use of selective etching to define the monocrystalline regions grown. The reactors employed are very costly; moreover, the temperature at which epitaxy is achieved is relatively high (1150° C.).

A variant of the process is also described in the previously cited patent application, wherein the active source and drain regions are obtained by recrystallization, by means of a laser, of a layer of deposited polycrystalline silicon, instead of by epitaxial growth. Nevertheless, recrystallization by means of a laser is not industrially advantageous for large-scale production.

SUMMARY OF THE INVENTION

The scope of this invention is the embodiment of a process for fabrication of insulated-gate field-effect transistors with junctions of minimum depth, which, with respect to the known processes, is more economical and permits more reliable products to be achieved.

A process for producing an insulated gate field effect transistor on a predetermined area of a monocrystalline silicon substrate of a first type of conductivity in accordance with the present invention, comprises the steps of:

forming a first insulating layer in a first predetermined region of the predetermined area of the substrate;

forming a conducting layer on the first insulating layer and forming a second insulating layer on the conducting layer, the first insulating layer and the conducting layer respectively forming a gate dielectric and a gate electrode of the transistor;

forming insulating walls on at least uncovered portions of edges of the conducting layer;

forming a polycrystalline silicon layer including an ionic implantation step for implanting the layer with impurities which cause the layer to have a second type of conductivity which is opposite to the first type of conductivity, the atomic species of such impurities, the concentration thereof and the implantation energy being selected so as to inject the impurities into the substrate in regions of the predetermined area in which the substrate is in direct contact with the polycrystalline silicon layer and to cause the conversion of polycrystalline silicon to amorphous silicon in at least a second predetermined region of the predetermined area, and including a low temperature heat treatment step for causing an epitaxial-type recrystallization into monocrystalline silicon of at least parts of the polycrystalline silicon layer previously converted into amorphous silicon, the recrystallized monocrystalline silicon parts forming drain and source regions of the transistor.

BRIEF DESCRIPTION OF THE DRAWINGS

The abovenoted objective is accomplished with the process defined and characterized by the attached claims, also described hereinbelow, as an example, and thus nonlimiting, and represented in the attached drawings in which

DESCRIPTION OF THE PREFERRED EMBODIMENT

Figure 1:
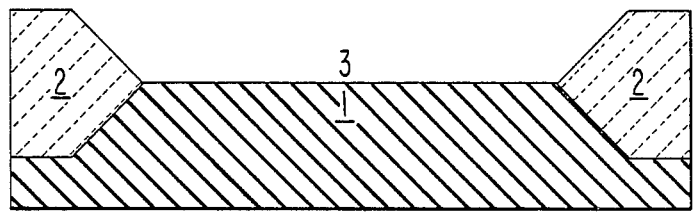
FIGS. 1, 2, 3, 4, 5, 6, 7, and 8 illustrate, in a vertical section, a greatly enlarged portion of an IGFET transistor, during certain stages of its formation.

The initial structure, illustrated in FIG. 1, is obtained with operations known to those skilled in the art and comprises a substrate 1 of P type monocrystalline silicon, with a low concentration of doping impurities (around $10^{15}$ atoms/cm$^3$), wherein a predetermined region 3 is designated to receive the IGFET. Outside the region 3, the substrate is covered with a layer 2 of silicon dioxide (SiO$_2$), that constitutes a field dielectric, able to isolate this active region from other regions.

Figure 2:
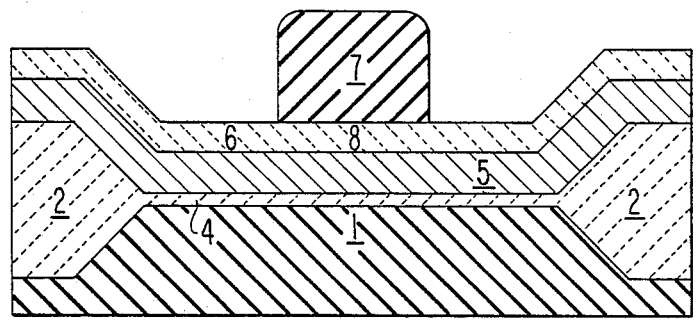
Figure 3:
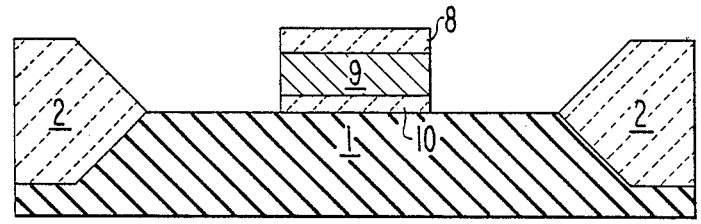
Figure 4:
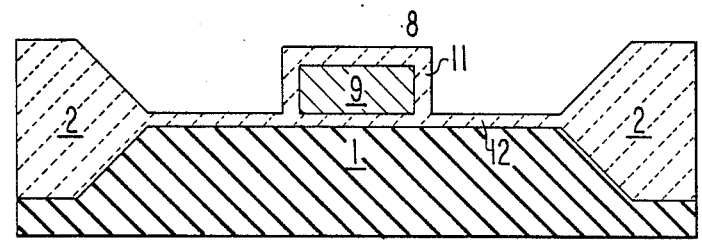
Figure 5:
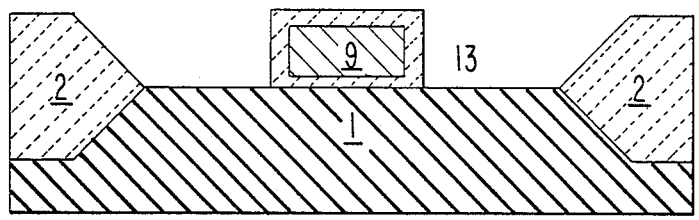

With reference to FIG. 2, the following operations are performed in succession on this structure:

thermal oxidation, at a temperature of approximately 1000° C., of the uncovered surface of the substrate 1, to form a layer 4 of silicon dioxide (FIG. 2) with a thickness of approximately 30 nm, able to constitute the gate dielectric of the final transistors;

deposition by silane (SiH$_4$) of a layer 5 of polycrystalline silicon (FIG. 2) approximately 500 nm thick. The deposition is carried out with the LPCVD technique (Low Pressure Chemical Vapor Deposition) at a temperature of approximately 600° C.;

doping of the layer 5 of polycrystalline silicon by means of predeposition by phosphorous oxychloride (POCl$_3$) at a temperature of approximately 920° C. The concentration of N type doping impurities is on the order of $10^{20}$ atoms/cm$^3$;

diffusion of the doping impurities in the layer 5 of polycrystalline silicon and growth of a film 6 of silicon dioxide, with reference to FIG. 2, of a thickness of some tens of nanometers, by means of exposure in an oxidizing environment at a temperature of approximately 1000° C.;

formation (by means of known photolithographic operations) of a mask 7 of photoresist that protects a predetermined area 8 of the layer 6 of silicon dioxide. This mask delimits an IGFET gate area located above a region of the substrate designated to function as the transistor channel, with reference to FIG. 3;

removal of the unprotected portions of the layers 6, 5, and 4, by means of selective or physical etching (wet etching or plasma etching) in a manner to delimit a portion 8 of silicon dioxide, a portion 9 of polycrystalline silicon, a portion 10 of gate oxide (defining the gate) arranged on top of each other in this predetermined area;

thermal oxidation of the uncovered silicon surfaces at a relatively low temperature, approximately 800° C., to grow a layer of oxide, the thickness of which depends on the concentration of doping impurities in the silicon. Thus, a layer 11 of the silicon dioxide may grow of a thickness of approximately 150 nm, on the edges and on the surface of the portion 9 of polycrystalline silicon, in which the concentration of doping agent is around $10^{20}$ atoms/cm$^3$, while on the uncovered area of the substrate 1, in which the concentration of doping agent is around $10^{15}$ atoms/cm$^3$, a layer 12 of silicon dioxide grows, of a thickness of approximately 35 nm (FIG. 4);

chemical etching of the silicon dioxide until the layer 12 is completely removed, uncovering the surface of the substrate 1 where the layer of oxide is thinner (using diluted hydrofluoric acid for example). This etching does not however uncover the portion 9 of polycrystalline silicon, since it is covered by a very thick layer of oxide. The portion 9 of polycrystalline silicon, that is used to constitute the gate electrode of the IGFET, is thereby completely surrounded by the silicon dioxide 13, as appears in FIG. 5. The thickness of the field oxide 2 does not undergo a significant reduction. This etching prepares the surface of monocrystalline silicon for a subsequent deposition of polycrystalline silicon.

Figure 6:
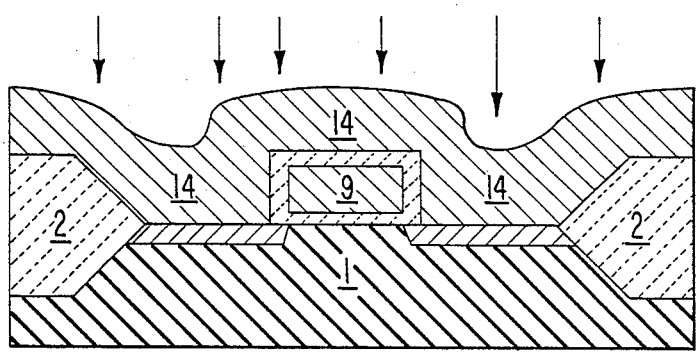
Figure 7:
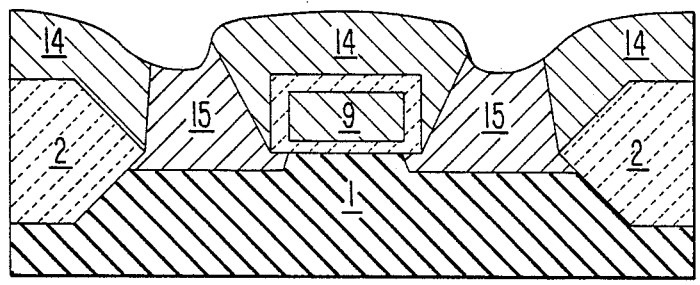

According to the present invention, additional operations are as follows:

deposition of layer of predetermined thickness of polycrystalline silicon (approx. 500 nm), 14, in a low-pressure oven (LPCVD) as illustrated in FIG. 6;

ion implantation, indicated symbolically in FIG. 6 by means of vertical arrows, of an atomic species able to render the layer of polycrystalline silicon amorphous (e.g.—arsenic); this implantation must be executed with an energy such as to slightly cross the monocrystalline to polycrystalline interface, indicated with hatched lines in FIG. 6, the implanted dose must then be such as to render the layer of polycrystalline silicon completely amorphous;

recrystallization heat treatment at temperatures between 450° and 600° C., suited to permit the total recrystallization as monocrystalline silicon of the implanted layer, 15, by solid phase epitaxy. As illustrated in FIG. 7, epitaxy does not, however, take place in the zones above the amorphous layer (SiO$_2$) and the polycrystalline silicon 14, remains.

Figure 8:
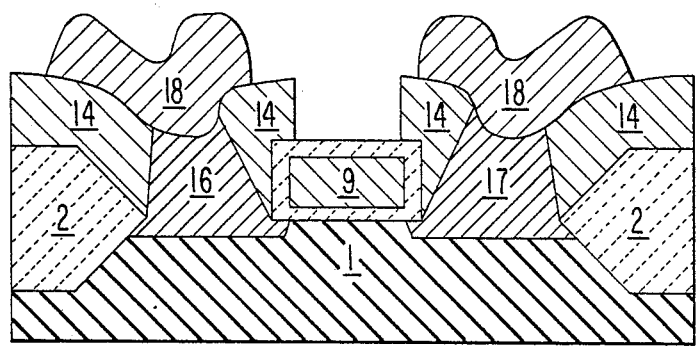

The operations for the formation of a mask of "photoresist" and the subsequent removal, by means of chemical etching or plasma etching of the excess polycrystalline then take place so as to separate, as illustrated in FIG. 8, the source and drain regions of the final transistor, defining, with the same operations, even the interconnection strips. Finally, the deposition of the metalization, 18, and its definition, above the source and drain contacts, 16–17, as illustrated in FIG. 8.

In the process according to the present invention, the doping agent is implanted with minimum depth, within the regions of polycrystalline silicon, 16–17, so that the subsequent heat treatments at an elevated temperature do not cause the diffusion of this doping agent into the substrate 1, and the source and drain junctions do not therefore fall below the gate oxide-substrate interface.

Under the circumstances, there are no lateral capacitances of the junction. The absence of these capacitances enables one to obtain a high speed response in the transistor. Moreover, instead of extending laterally as in the case of IGFETs of the prior art, the emptied zones extend vertically, below the active regions, so that the effective length of the transistor increases and the risk of punch-through phenomena is reduced.

The advantage of the present invention is that one can use polycrystalline silicon of a type that is normally produced and deposited at a low temperature, instead of resorting to an epitaxial silicon grown at 1150° C. in special reactors, in order to produce the sources and drains of the FET transistors.

As described above, epitaxial regrowth of the initially deposited layer occurs with relative ease, converting the polycrystalline silicon into monocrystalline silicon after rendering the entire layer amorphous by ionic implantation. It is, in effect, sufficient to heat to a relatively low temperature (500°–600° C.) in order to obtain the regrowth of the deposited layer in alignment with the crystalline arrangement of the substrate. This treatment also permits improvement of the value of the resistivity of the layer obtained over that of the polycrystalline silicon.

It is important to note that, while with the process incorporating the present invention, one can produce an interconnection level of polycrystalline silicon in the zones outside of the substrate; this is not possible with the known process described above, because in epitaxial reactors, no polycrystalline silicon of the gaseous phase can grow in such zones exterior to the substrate.

With respect to typical structures of standard transistors (N-MOS and C-MOS), not described in this context, but known to those skilled in the art, the following advantages are given: a more planar structure is attained, avoiding abrupt steps for the metalizations; the problem of contact between the metalization and the thin junction is eliminated since the junction obtained with the present invention is thick but of a depth which is nearly zero; the design rule that defines the minimum gate-contact distance is also eliminated since it is no longer critical.

Although only one example of execution of the present invention has been illustrated and described, it is obvious that numerous variants are possible, without departing from the scope of the invention.

I claim:

1. A process for producing an insulated gate field effect transistor on a first region of a monocrystalline silicon substrate of a first type of conductivity, comprising the steps of:

forming a first insulating layer on a second region of the substrate contained within the first region thereof;

forming a conducting layer on the first insulating layer and then forming a second insulating layer on the conducting layer, the first insulating layer and the conducting layer respectively forming a gate dielectric and a gate electrode of the field effect transistor;

forming insulating walls on at least uncovered portions of edges of the conducting layer;

forming a polycrystalline silicon layer overlaying at least the first region and implanting the polycrystalline silicon layer with impurities for causing it to have a second type of conductivity which is opposite to the first type of conductivity, wherein the atomic species of such impurities, the concentration thereof and the implantation energy are selected so as to inject the impurities into the substrate where the substrate is in direct contact with the polycrystalline silicon layer and so as to cause the conversion of polycrystalline silicon to amorphous silicon;

and including a low temperature heat treatment step for causing an epitaxial rerystallization into monocrystalline silicon of at least parts of the polycrystalline silicon layer which have been previously converted into amorphous silicon, the recrystallized monocrystalline silicon parts forming drain and source regions of the field effect transistor.

2. A process as set forth in claim 1, wherein the atomic species of the impurities used for the ionic implantation is arsenic.

3. A process as set forth in claim 1, including the step of defining interconnections in parts of the polycrystalline layer which have not been changed to monocrystalline silicon by the low temperature heat treatment step.

4. A process as set forth in claim 1, wherein the heat treatment temperature is in the range of from 450° to 600° C.

* * * * *